US007309619B2

(12) United States Patent
Hasegawa et al.

(10) Patent No.: US 7,309,619 B2
(45) Date of Patent: Dec. 18, 2007

(54) LIGHT-EMITTING ELEMENT, PRODUCTION METHOD THEREOF, AND LIGHT-EMITTING APPARATUS

(75) Inventors: Toshinori Hasegawa, Kanagawa (JP); Yoichi Osato, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/586,559

(22) Filed: Oct. 26, 2006

(65) Prior Publication Data

US 2007/0042517 A1 Feb. 22, 2007

Related U.S. Application Data

(62) Division of application No. 10/488,882, filed as application No. PCT/JP02/12062 on Nov. 19, 2002, now Pat. No. 7,163,831.

(30) Foreign Application Priority Data

Nov. 22, 2001 (JP) .............................. 2001-357713

(51) Int. Cl.
*H01L 21/00* (2006.01)
(52) U.S. Cl. ............ 438/22; 257/E33.055; 257/E33.06
(58) Field of Classification Search .................. 438/22, 438/29; 257/E33.001, E33.055, E33.06, 257/E33.062, 21.001
See application file for complete search history.

(56) References Cited

U.S. PATENT DOCUMENTS

| 5,739,635 A | 4/1998 | Wakimoto .................. 313/504 |
| 5,776,622 A | 7/1998 | Hung et al. ................. 428/690 |
| 6,013,384 A | 1/2000 | Kido et al. .................. 428/690 |
| 7,163,831 B2 * | 1/2007 | Hasegawa et al. ............. 438/22 |

FOREIGN PATENT DOCUMENTS

| EP | 0 740 489 | 10/1996 |
| EP | 0 855 848 | 7/1998 |
| JP | 06-163158 | 6/1994 |
| JP | 09-017574 | 1/1997 |
| JP | 10-270171 | 10/1998 |
| JP | 10-270172 | 10/1998 |
| JP | 2001-196176 | 7/2001 |

OTHER PUBLICATIONS

Patent Abstracts of Japan, vol. 1999, No. 01, Jan. 29, 1999 (corresponds to JP 10-270172).
Patent Abstracts of Japan, vol. 1999, No. 01, Jan. 29, 1999 (corresponds to JP 10-270171).
J. Kido, et al., "Bright Organic Electroluminescent Devices Having a Metal-Doped Electron-Injecting Layer", Appl. Phys. Lett., vol. 73, No. 20, pp. 2866-2868 (1998).
G.E. Jabbour, et al., "Organic-Inorganic Insulator Mixed Buffer Layer for Efficient and Bright Organic Light-Emitting Devices Based on Aluminum Cathode", Extended Abstracts, 4th Int'l Conf. on Science and Tech. of Display Phosphors, Bend, OR, pp. 49-51 (Sep. 14-17, 1998).
T. Wakimoto, et al., "Organic EL Cells Using Alkaline Metal Compounds as Electron Injection Materials", IEEE Transactions on Electronic Devices, vol. 44, No. 8, pp. 1245-1248 (1997).

* cited by examiner

*Primary Examiner*—Scott B. Geyer
(74) *Attorney, Agent, or Firm*—Fitzpatrick, Cella, Harper & Scinto

(57) ABSTRACT

The present invention provides an light-emitting element in which an organic compound layer containing a carbonate, for example $Cs_2CO_3$ and $Li_2CO_3$, as a dopant is in substantially electrical contact with a cathode by providing an organic compound layer having a dopant easy in handling so as to bring the organic compound layer into contact with the cathode. The light-emitting element includes a pair of electrodes sandwiching the organic compound layer, which is a co-evaporation layer of an organic compound and the carbonate.

6 Claims, 5 Drawing Sheets

LIGHT-EMITTING ELEMENT, PRODUCTION METHOD THEREOF, AND LIGHT-EMITTING APPARATUS

CROSS-REFERENCE TO RELATED APPLICATION

This application is a division of Application Ser. No. 10/488,882, filed on Mar. 8, 2004, which in turn, is the National Stage of PCT/JP02/12062, filed Nov. 19, 2002.

TECHNICAL FIELD

The present invention relates to a light-emitting element which is provided with at least one layer an organic compound between an anode and a cathode, and a production method thereof, and a light-emitting apparatus having the light-emitting element.

BACKGROUND ART

A light-emitting element is a so-called organic electroluminescent element in which, by an electric current flowing between the cathode and anode, an organic compound between both electrodes is made to emit light.

A general sectional structure of a light-emitting element is shown in FIG. 1. In the FIG. 1, 1 denotes a transparent substrate, 2 a transparent electrode (anode), 3 a hole transporting layer, 4 a light-emitting layer, 5 an electron transporting layer, 6 an electron injecting layer, and 7 a cathode.

In this light-emitting element, an exciton is generated by the recombination of the electron, injected to the light-emitting layer 4 from the cathode 7 through the electron injecting and transporting layers 5 and 6, and the hole injected to the light-emitting layer 4 from the transparent electrode 2 through the hole transporting layer 3. The light-emitting is an element which takes advantage of the light emitted when the exciton returns to the ground state.

For the cathode 7 of such a light-emitting element, there is used a material which has a relatively small work function and satisfactory electron injection characteristics, for example, an elemental metal such as magnesium (Mg) or a metal alloy such as Ag—Mg and Al—Li alloys.

In addition, Patent document 1 discloses a configuration in which an organic layer containing a metal functioning as a donor (electron donating) dopant is provided in contact with the cathode. As the metal used as the donor (electron donating) dopant, Patent document 1 discloses alkali metals, alkaline earth metals, and transition metals inclusive of rare earths.

In addition, Patent document 2 discloses a configuration in which an organic layer having a metal oxide or a metal salt as a dopant is provided in contact with the cathode.

Patent document 1:Japanese Patent Application Laid-Open No. 10-270171 (page 2, lines 9 to 13, and FIG. 1).

Patent document 2:Japanese Patent Application Laid-Open No. 10-270172 (page 2, lines 2 to 7, and FIG. 1).

As these dopants, metals each having a work function as small as possible, and the oxides and metal salts containing such metals are preferable. Such a metal is generally high in reactivity, and hence handling such a metal is very tough. In addition, when a metal oxide or a metal salt containing such a metal is used as a dopant, the dopant becomes higher in stability, but still some of the metal oxides and metal salts are unstable so that handling thereof in the usual air environment is not easy. On the other hand, some others of the metal oxides and metals salts can be handled in the air, but they are still unstable so that it is difficult to introduce them each as a dopant into the organic layer provided in contact with the cathode, as the case may be. Accordingly, the uneasy handling of them as the dopants can be a cause for the low process yield and the cost rise in the production of the light-emitting element.

DISCLOSURE OF THE INVENTION

The present invention provides a light emitting element having a dopant easy in handling and the production method thereof.

Specifically, the present invention provides a light-emitting element comprising: a pair of electrodes consisting of an anode and a cathode, and an organic compound layer provided between the pair of electrodes, wherein the organic compound layer in substantially electrical contact with the cathode is composed of at least an organic compound and a carbonate, and a molar ratio of the organic compound to the carbonate in the organic compound layer is in a range from 1:0.01 to 1:100.

In addition, the present invention provides a production method of a light-emitting element comprising a pair of electrodes consisting of an anode and a cathode, and an organic compound layer provided between the pair of electrodes, which method comprises: an organic compound forming step of providing at least an organic compound and a carbonate for constituting the organic compound layer, on the side of the cathode to form the organic compound layer, and a step of providing the cathode to come into substantially electrical contact with the organic compound layer, wherein the organic compound layer forming step is the step of forming the organic compound layer in a molar ratio of the organic compound to the carbonate ranging from 1:0.01 to 1:100.

BEST MODE FOR CARRYING OUT THE INVENTION

First Embodiment

Figure 1:
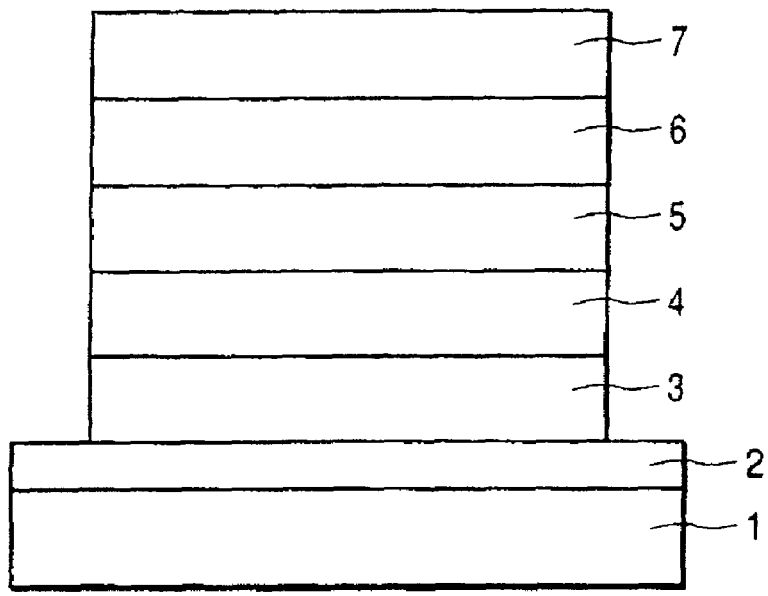
FIG. 1 is a schematic diagram showing an example of the stacked layer configuration in a general light-emitting element.

The light-emitting element of the first embodiment of the present invention is a light-emitting element which has at least a pair of electrodes (an anode and a cathode) and a light-emitting layer interposed between the pair of electrodes, wherein a dopant in an organic compound layer in contact with the cathode is a carbonate. In other words, the attention is paid to an anion in the salt. A carbonate is easy in handling. Among the carbonates, it is preferable that the carbonate is a carbonate of an alkali metal or a carbonate of an alkaline earth metal in-view of the easiness in handling. Needless to say, the respective carbonates (of the alkali metals and alkaline earth metals) may be simultaneously contained in the organic compound layer, or there may be mixed other additives facilitating the electron injection or transportation in addition to the organic compound and the carbonate.

As a reason why the carbonate is preferable, there may be said the improvement in the durability of an element to be obtained. The durability means the element life duration. This is because that the carbonate is relatively large in molecular weight so that it is expected the carbonate is difficult to migrate in the organic compound layer when the element is driven to operate. Furthermore, the satisfactory affinity of the carbonate with the organic compound constituting the organic compound layer may be said as a reason why the carbonate is preferably used.

Under the favor of the organic compound layer, electrons are efficiently supplied from the cathode to the light-emitting layer. Consequently, in the present embodiment, when a metal material to be used in the cathode is chosen, there is no limitation caused by consideration of the work function of the material; in other words, even when there are used such electrode materials having relatively high work functions as ITO, gold, silver, and the alloys thereof, the satisfactory electron injection into the light-emitting element becomes possible.

In the present embodiment, the carbonate which can particularly preferably be used is at least any one of cesium carbonate ($Cs_2CO_3$) and lithium carbonate ($Li_2O_3$). Among others, the light-emitting element, in which ITO is used as the cathode and either cesium carbonate or lithium carbonate is used as the dopant, has a satisfactory optical transmittance, so that light can be brought out from the cathode, and it is suitable as a so-called top emission type light-emitting element. Needless to say, a light-emitting element of the present invention may be a light-emitting element having a mode in which light is brought out from the anode. Incidentally, the organic compounds may be those well known in the art, and there can be cited, for example, Alq3 as shown in Example 1. The optical transmittance of the organic compound layer in contact with the cathode is 80% or above in the wavelength range from 450 nm to 700 nm (that is, 450 nm or above and 700 nm or below; the same is applied hereinafter), and furthermore 95% or above.

In addition, the film thickness of the organic compound layer containing a carbonate falls in the range from 0.1 to 10000 nm, preferably in the range from 1 to 500 nm. Incidentally, the film thickness of the light-emitting layer can have an arbitrary value. In order to obtain a high light-emitting efficiency, it is preferable that there-is a sufficient recombination region along the film thickness direction in the light-emitting layer; the film thickness of the light-emitting layer is generally of the order of from 15 to 20 nm. A light-emitting element according to the present embodiment may have a light-emitting layer having a film thickness of approximately such an order of magnitude.

In a light-emitting element of the present embodiment, the main organic compound constituting an organic compound layer is a small-molecular (monomer) compound.

The small molecular (monomer) compound is defined in the present invention as an organic compound which has a molecular weight of 2000 or below, more preferably 1000 or below.

The specific types of such organic compounds will be described below.

The quantitative ratio of the organic compound and the carbonate is described below.

The quantitative ratio of the organic compound to the carbonate falls within the range from 1:0-0.01 to 1:100 in molar ratio. Preferably the ratio falls within the range from 1:0.1 to 1:10. The molar ratio as referred to here means the ratio of the number of moles of the organic compound introduced to the organic compound layer to the number of moles of the carbonate. In particular, in the case of using the carbonate containing an alkaline metal as cation in the molar ratio of 1:0.5, electrons can be supplied efficiently from the cathode to the light-emitting layer.

Incidentally, as for the above ratio of 1:0.5, a margin of deviation of the order of approximately 20% are acceptable; that is, the particularly preferable molar ratio falls within the range from 1:0.4 to 1:0.6. The reason why the effect becomes best for the molar ratio of 1:0.5 cannot be stated clearly at present; it is conceivable that such a ratio is a quantitative ratio relationship suitable for the interaction between the organic compound and the carbonate.

In the case of using the carbonate such as cesium carbonate in the organic compound layer, even when alminum or a transparent conductive oxide such as ITO is used as the cathode, good electron injection from the cathode to the organic compound layer is realized to obtain a remarkably good result of the light-emitting efficiency of the light-emitting element. Among them, the element using ITO is preferably used as the top emission type light-emitting element in which light is taken out from one electrode of the pair of electrodes opposing to the substrate side toward the outside of the element.

That is, the present invention can provide a light-emitting element having the features of using the organic compound layer containing the carbonate and using the transparent conductive oxide such as ITO and IZO as the cathode. The present invention can be also provide a top emission type light-emitting element having the above-described features.

On the other hand, the element having a single layer of a conventionally used material such as lithium fluoride in place of the organic compound layer, and the element having the organic compound layer containing the material such as lithium fluoride exhibit inferior electron injection in any case of using aluminum and a transparent conductive oxide as the cathode. Among them, in the case of using the transparent conductive oxide as the cathode, the electron injection scarely occurs, and therefore the electron injection of the element is remarkably bad.

In addition, another layer may be provided between the cathode and the organic compound layer. The another layer may be an organic layer, an inorganic layer, or a mixed layer of organic and inorganic compounds. To be more specific, it may be a LiF layer. Incidentally, by providing such another layer, the electron injection is further improved. Even with the another layer being provided, it can be said that the cathode and the organic compound layer is in substantially electrical contact with each other.

When an organic compound layer composed of an organic compound and a carbonate is formed, it is preferable to co-evaporate both of them. In particular, it is preferable that the organic compound layer is formed while the carbonate being in a heated state. The formation of the organic compound layer while the carbonate being in a heated state makes the current density of the light-emitting element to reach a practically preferable level.

When the carbonate is heated to be used, the carbonate such as cesium carbonate and lithium carbonate can be heated at approximately from 150° C. or above to 700° C. or below. The temperature range is a relatively lower temperature range. Additionally, in such a temperature range, the carbonate can be handled simultaneously with the organic compound while both being heated. The temperature region (range) may fall in any of the temperature regions of the melting point, decomposition point, and decomposition starting point of the carbonate. For example, it is preferable that the decomposition starting point of cesium carbonate is about 610° C.; and it is also preferable that the decomposition starting point of lithium carbonate is 615° C.

The reason why it is preferable to heat the carbonate cannot be stated positively at present, it is conceivable that the heating is preferable for the purpose of attaining the above described interaction.

Alternatively, when the carbonate is heated, the carbonate may reduce the organic compound simultaneously. This may make possible it to decrease the barrier for the electron injection from the cathode, thereby lowering the driving voltage of the element, even when such stable metals as gold (Au) and silver (Ag), and a transparent ITO electrode are used.

In addition, the carbonate (for example, $Cs_2CO_3$) is more preferable as compared to the elemental metal (for example, the elemental metal of cesium). It is conceivable that this may be because the carbonate has the larger molecular weight (that is, heavier weight) as compared to the elemental metal of cesium, whereby the carbonate makes the migration of the cesium element difficult.

The film formation of the organic compound layer may be carried out by any film formation method. For example, an evaporation method and a sputtering method can be used. The carbonates can be heated in these methods, and hence are preferable methods.

The present embodiment is described below in more detail and more specifically.

As a material doped in the organic layer in contact with the cathode, the present inventors discovered a specific material which is easily available, which is handled without necessity of a special working environment for eliminating the contact with the air and the moisture, and furthermore which can be applied to the film formation with the general methods such as the resistive heating and the like. That is, the discovered material the carbonate.

In addition, the light-emitting element of the present embodiment can be applied to a display device such as a light-emitting element array having a plurality of light-emitting elements and a display (irrespective as to whether monocolor or full color), and a light source for exposure of a photosensitive member in an electrophotography system (for example, a laser beam printer and a copying machine).

In addition, in the light-emitting element of the embodiment of the present invention, a material used for the cathode, can include aluminum (Al), silver (Ag), gold (Au), and indium tin oxide (ITO), or an alloy containing at least one of these metals, and the like. In addition to these, there can be used magnesium (Mg), platinum (Pt), palladium (Pd), selenium (Se), iridium (Ir), tin oxide, and copper iodide, or a mixed metal (for example, an alloy) containing at least one of these metals.

The light-emitting element of the embodiment of the present invention is not limited as to the order of the film formation for the cathode and the organic compound layer in contact with the cathode, and the order of the above-described film formation can be chosen without restraint.

Second Embodiment

Figure 2:
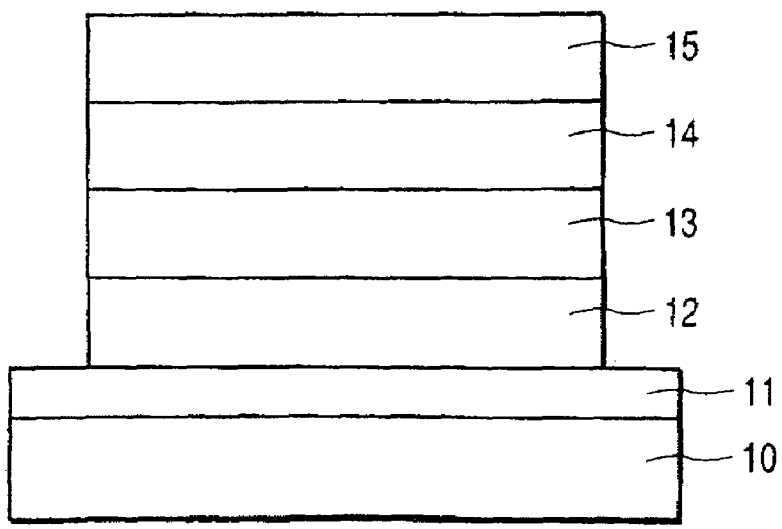
FIG. 2 is a schematic diagram showing an example of the stacked layer configuration of a light-emitting element in the present embodiment.

FIG. 2 is a schematic diagram showing the second embodiment of the present invention. The present embodiment is an embodiment in which the description of a portion of the light-emitting element of the first embodiment is extended to a description covering a layer configuration including the anode. In FIG. 2, the light-emitting element of the present invention is constituted by stacking, on a substrate 10, an electrode 11 for forming an anode, a hole transporting layer 12 having a hole transporting property, a light-emitting layer 13, an organic compound layer 14 composed of an organic compound and a carbonate, and an electrode 15 for forming a cathode.

In addition to the above, the configuration of the above-described organic compound layer can include the following configurations: electrode (anode)/light-emitting layer/organic compound layer/electrode (cathode); electrode(anode)/hole transporting layer/light-emitting layer/electron transporting layer/organic compound layer/electrode(cathode); electrode(anode)/hole injecting layer/light-emitting layer/organic compound layer/electrode(cathode); electrode (anode)/hole injecting layer/hole transporting layer/light-emitting layer/organic compound layer/electrode(cathode); and electrode(anode)/hole injecting layer/hole transporting layer/light-emitting layer/electron transporting layer/organic compound layer/electrode(cathode). The light-emitting element according to the present invention can have any element configuration as far as the organic compound layer 14 is provided on the interface with the cathode 15. Furthermore, specifically, it is desirable that the layer configuration has an order of the cathode, organic compound layer, and electron transporting layer (needless to say, as for the production sequential order, sometimes the layers are formed in the order of the electron transporting layer, organic compound layer, and cathode). In particular, in the case of this layer configuration, there can be suitably used, as the electron transporting layer, at least any of the metal complex compounds such as Alq3 and PBO, and the heterocyclic compounds and fused heterocyclic compounds such as oxazole, triazole, quinoxaline, triazine, and silole. By further providing such an electron transporting layer, the efficiency for the electron transportation from the cathode to the light-emitting layer is further improved. In this case, the material for the electron transporting layer and the organic compound mainly constituting the organic compound layer may be different compounds, but it is preferable that the material and the main organic compound is the same compound.

As for the compounds which can be used as the hole transporting layer 12 and the hole injecting layer, there is no particular limitation; for example, triphenyldiamine derivatives, oxadiazole derivatives, porphyryl derivatices, stilbene derivatives, and the like can be used, but there is no limitation to these compounds.

As for the compound which can be used as the material for the light-emitting layer 13, it can be adopted from triarylamine derivatives, stilbene derivatives, polyarylene, fused polycyclic aromatic compounds, heterocyclic aromatic compounds, fused heterocyclic aromatic compounds, metal complex compounds, and the like, and the homo-oligomers thereof, the composite oligomers thereof, or the like. In addition, one or more kinds of these light-emitting materials can be used and doped in the hole injecting layer, hole transporting layer, or electron transporting layer. These materials and configurations are not restricted to these.

As the electrode 11 for forming the anode, an electrode having a large work function is preferable; for example, there can be used indium tin oxide (ITO), tin oxide, gold (Au), platinum (Pt), chromium (Cr), palladium (Pd), selenium (Se), iridium (Ir), copper iodide, and the like, and alloys and the like.

The above-described hole transporting layer 12, hole injecting layer, light-emitting layer 13, and electron transporting layer may be produced by using any types of film forming methods; for example, there can be used the evaporation method, sputtering method, CVD method, molecular beam evaporation method (MBE method), dipping method, spin coating method, casting method, bar coat method, roll coat method, ink jet method, and the like.

In addition, in the light-emitting element described in the present embodiment of the present invention, it is possible to take a configuration in. which the element is protected from the oxygen and moisture by providing a protection layer made of an organic material or an inorganic material, without introducing any adverse effects on the characteristics of the present invention. In addition, it is also possible to improve environmental resistance of the element by enclosing the element with an inert gas.

Third Embodiment

The light-emitting element according to the third embodiment of the present invention has a configuration in which an additional layer is provided between the organic compound layer and the light-emitting layer. Except this, the present embodiment is the same as the second embodiment. As for the present embodiment, among the layer configurations described in the second embodiment, the layer configurations such as the configuration of electrode (anode)/hole transporting layer/light-emitting layer/electron transporting layer/organic compound layer/electrode (cathode) and the configuration of electrode (anode)/hole injecting layer/hole transporting layer/light-emitting layer/electron transporting layer/organic compound layer/electrode (cathode) are included in the category of the present embodiment. In addition to these configurations, there can be provided a block layer between the light-emitting layer and the organic compound layer, to be more specific, a layer functioning as a hole blocking layer. Incidentally, the hole blocking layer may have the ability of the electron transporting ability or the electron injecting ability. The following descriptions in an itemized form are prepared for the block layer, and any of the following items from A to F is acceptable.

A. As a material constituting the block layer, a metal complex compound can be used.
B. As a material constituting the block layer, a heterocyclic compound can be used.
C. As a material constituting the block layer, a fused heterocyclic compound can be used.
D. As a material constituting the block layer, an aluminum chelate complex (Alq3) can be used.
E. As a material constituting the block layer, bathophenathroline can be used.
F. As a material constituting the block layer, bathocuproin can be used.

EXAMPLES

Description will be made below on the preferred examples of the present invention, by referring to the drawings, with cesium carbonate as an illustrative example of the carbonate, but lithium carbonate can also be applied, that is, the present invention is not limited to the present examples.

Example 1

Example 1 is illustrated in FIG. 2. In FIG. 2, numeral 10 denotes a transparent substrate, 11 an ITO layer as an anode electrode for use in hole injection, 12 a hole transporting layer, 13 a light-emitting layer, 14 an organic compound layer, and 15 a cathode electrode.

A film of indium tin oxide (ITO) of 120 nm in thickness was formed by the sputter method on the transparent substrate 10, and the transparent anode electrode 11 was obtained. Subsequently, the substrate was subjected to ultrasonic cleaning successively with acetone and isopropyl alcohol (IPA), and then cleaned in boiling IPA and dried. Furthermore, the substrate was subjected to UV/ozone cleaning.

Then, using a vacuum evaporation apparatus (manufactured by Shinku-Kiko, Inc.), on the cleaned substrate, α-NPD having hole transporting property represented by the following chemical formula 1:

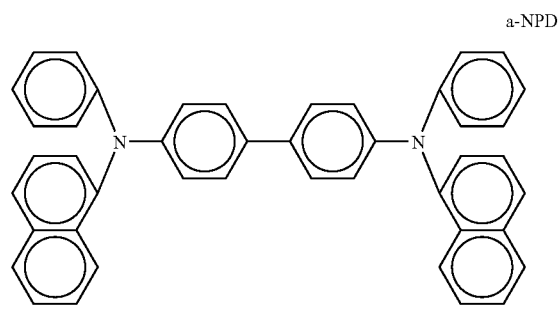

a-NPD was evaporated by the vacuum evaporation method to form a film of 35 nm in thickness as the hole transporting layer 12. The film was formed under the conditions that the degree of the vacuum when evaporating was $1.0 \times 10^{-6}$ Torr, and the film formation rate was from 0.2 to 0.3 nm/sec. Then, on the hole transporting layer 12, an aluminum chelate complex (hereinafter referred to as "Alq3") represented by the following chemical formula 2:

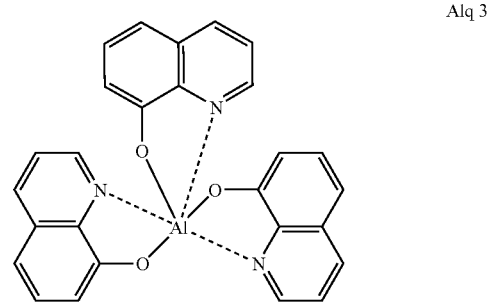

Alq 3 was evaporated by the vacuum evaporation method to form a film of 15 nm in thickness as the light-emitting layer 13 under the same conditions as those for the film formation of the hole transporting layer 12. Then, on the light-emitting layer 13, Alq3 and cesium carbonate ($Cs_2CO_3$) were evaporated to form a film of 35 nm in thickness as the organic compound layer 14 in such a way that the evaporation rates of the Alq3 and cesium carbonate were respectively so adjusted that the Alq3 and cesium carbonate were mixed in the film thickness ratio of 9:1. Finally, aluminum (Al) was evaporated to form the cathode electrode 15 having a thickness of 150 nm on the organic compound layer 14 under the condition of the evaporation rate of 1 nm/sec. The molar ratio is a ratio calculated from the molecular weight and specific gravity of the materials for forming the organic compound layer, and the ratio of film thicknesses. The molar ratio of Alq3 to cesium in the organic compound layer was 1:0.57.

Figure 3:
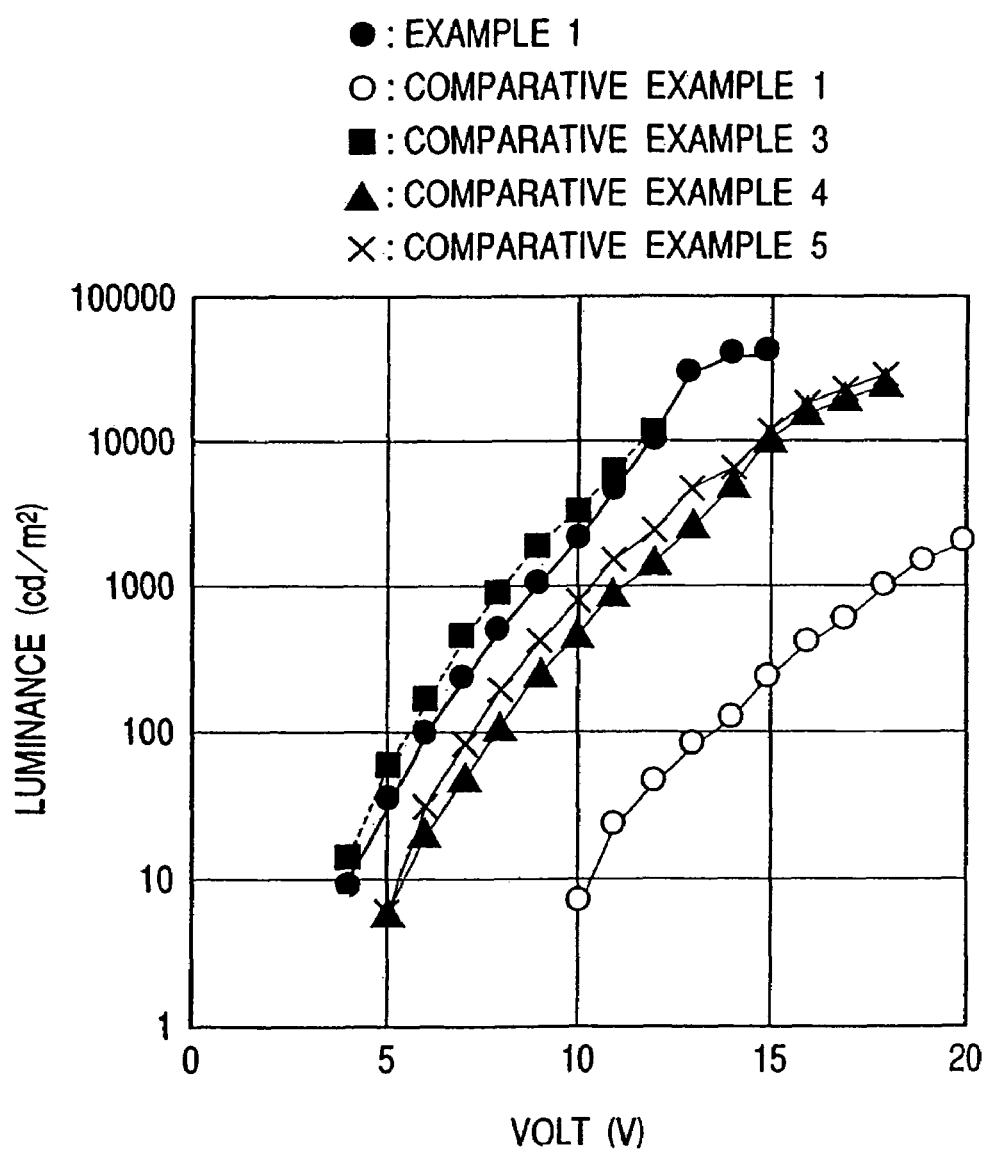
FIG. 3 is a graph showing the voltage-luminance characteristics of the light-emitting elements in the examples and comparative examples of the present invention.
Figure 4:
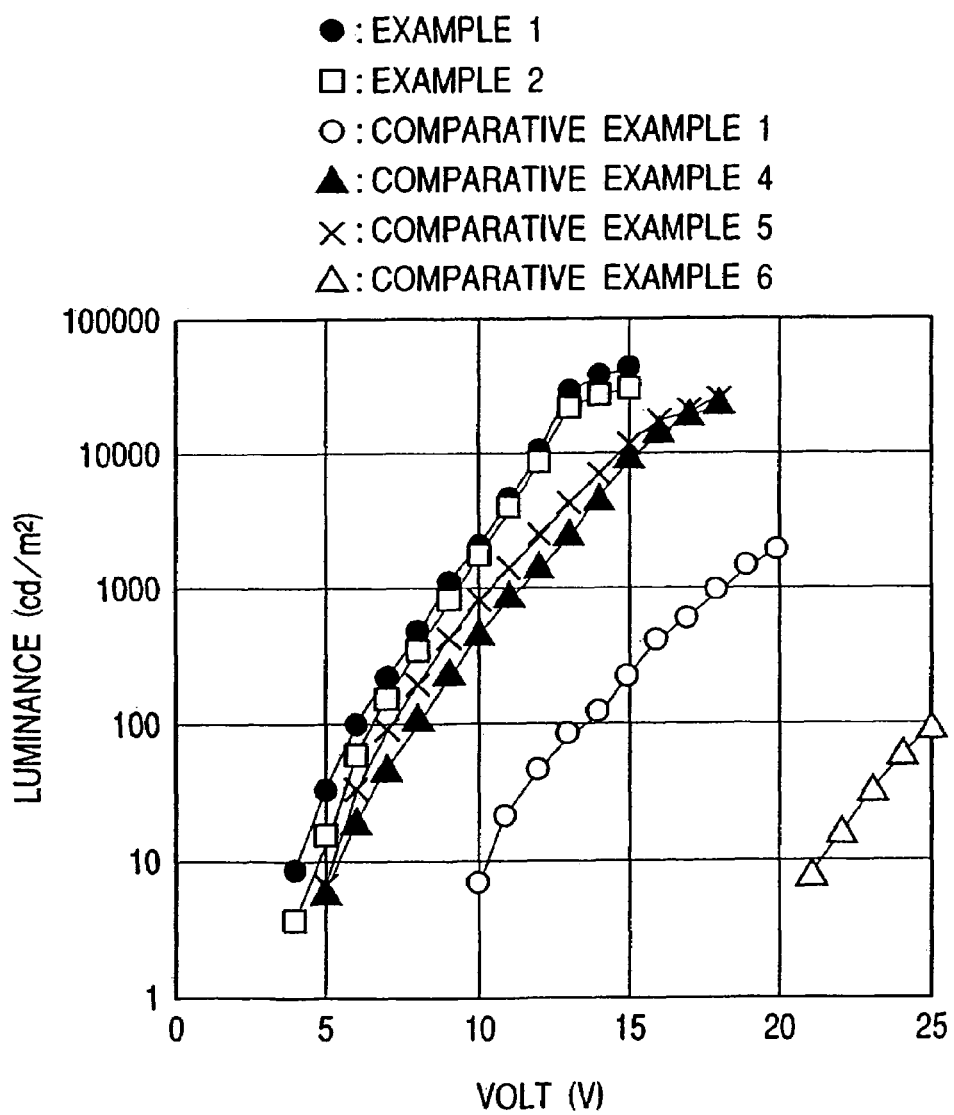
FIG. 4 is a graph showing the voltage-luminance characteristics of the light-emitting elements in the examples and comparative examples of the present invention.

In this way, a light-emitting element was obtained by providing, on the transparent substrate. 10, the anode electrode 11, hole transporting layer 12, light-emitting layer 13, organic compound layer 14, and cathode electrode 15. Successively, while a direct current voltage was applied between the ITO as the anode electrode 11 and the aluminum as the cathode electrode 15 in the light-emitting element, the light-emitting characteristics of the element were measured. Consequently, the element exhibited a maximum luminance of 41200 $cd/m^2$ and a current density of 3200 $mA/cm^2$ at an applied voltage of 15 V. In addition, the element exhibited a maximum efficiency of 0.91 lm/W at an applied voltage of 5 V. The voltage-luminance characteristic of the light-emitting element is shown in FIG. 3 and FIG. 4.

Comparative Example 1

The present comparative example is different from Example 1 in the point that carbonate is not used.

Under the conditions similar to those in Example 1, at the beginning, an α-NPD film of 35 nm in thickness was formed as the hole transporting layer 12 on the ITO as the anode electrode 11, and thereon an Alq3 film of 50 nm in thickness was formed as the light-emitting layer 13. Finally, aluminum (Al) was evaporated in a thickness of 150 nm as the cathode electrode 15.

In this way, a light-emitting element was obtained by providing, on the transparent substrate 10, the anode electrode 11, hole transporting layer 12, light-emitting layer 13, organic compound layer 14, and cathode electrode 15. Successively, while a direct current voltage was applied between the ITO as the anode electrode 11 and the aluminum as the cathode electrode 15 in the light-emitting element, the light-emitting characteristics of the element were measured. Consequently the element exhibited a maximum luminance of 1926 $cd/m^2$ and a current density of 350 $mA/cm^2$ at an applied voltage of 20 V. In addition, the element exhibited a maximum efficiency of 0.17 lm/W at an applied voltage of 12 V. The voltage-luminance characteristic of the light-emitting element is shown in FIG. 3 and FIG. 4.

From comparison of the voltage-luminance characteristics of Example 1 and Comparative Example 1 shown in FIG. 3, the light-emitting element shown in Example 1 which used cesium carbonate in the organic compound layer is seen to be largely decreased in the driving voltage as compared with the element of Comparative Example 1. Accordingly, the organic compound layer is seen to be effective in lowering the driving voltage of the element.

Comparative Example 2

The present comparative example shows that the film formation of metallic cesium, tough in handling, was attempted by the same process as that in Example 1, but it could not carried out.

Under the conditions similar to as those in Example 1, at the beginning, an α-NPD film of 35 nm in thickness was formed as the hole transporting layer 12 on the ITO as the anode electrode 11, and thereon an Alq3 film of 15 nm in thickness was formed as the light-emitting layer 13. Then, as the organic compound layer 14, Alq3 and cesium (Cs) were attempted to mix with each other in the film thickness ratio of 9:1, but the metallic cesium high in reactivity could not be introduced into a film forming apparatus in the atmospheric environment so that the film could not be formed. Thus, in order to produce an element in which an alkali metal such as cesium (Cs) is introduced into the organic compound layer, there is needed a special work environment in which the alkali metal can be handled and the film thereof can be formed under the condition of prohibiting the contact with the air and moisture. The construction of such a work environment needs a high cost, and the time taken for producing an element becomes longer than that in the usual environment, and hence the element production throughput is lowered.

Comparative Example 3

In the present comparative example, a special apparatus was used for the purpose of using the cesium metal tough in handling.

Under the same conditions as those in Example 1, at the beginning, an α-NPD film of 35 nm in thickness was formed as the hole transporting layer 12 on the ITO as the anode electrode 11, and thereon an Alq3 film of 15 nm in thickness was formed as the light-emitting layer 13. Then, it was attempted that as the organic compound layer 14, Alq3 and cesium (Cs) were mixed to form a mixed film of 35 nm in thickness. In the present Comparative Example 3, the introduction of cesium into the organic compound layer 14 was performed using an alkali metal dispenser (manufactured by SAES Getter, Inc.) which could generate a high purity of alkali metal vapor in vacuum. Alq3 and cesium (Cs) were evaporated to form a film of 35 nm in thickness as the organic compound layer 14 in such a way that the evaporation rates of the Alq3 and cesium were respectively so adjusted that the Alq3 and cesium were mixed in the film thickness ratio of 9:1. Finally, aluminum (Al) was evaporated to form the cathode electrode 15 in a thickness of 150 nm on the organic compound layer 14 under the condition of the evaporation rate of 1 nm/sec.

In this way, a light-emitting element was obtained by providing, on the transparent substrate 10, the anode electrode 11 hole transporting layer 12, light-emitting layer 13, organic compound layer 14, and cathode electrode 15. Successively, while a direct current voltage was applied between the ITO as the anode electrode 11 and the aluminum as the cathode electrode 15 in the light-emitting element, the light-emitting characteristics of the element were measured. Consequently, the element exhibited a maximum luminance of 11000 $cd/m^2$ and a current density of 3085 $mA/cm^2$ at an applied voltage of 12 V. In addition, the element exhibited a maximum efficiency of 0.47 lm/W at an applied voltage of 5 V. The voltage-luminance characteristic of the light-emitting element is shown in FIG. 3.

Comparative Example 4

In the present comparative example, a salt other than the carbonates was used.

Under the conditions similar to those in Example 1, at the beginning, an α-NPD film of 35 nm in thickness was formed as the hole transporting layer 12 on the ITO as the anode electrode 11, and thereon an Alq3 film of 15 nm in thickness was formed as the light-emitting layer 13. Then, Alq3 and lithium fluoride (LiF) were evaporated to form a film of 35 nm in thickness as the organic compound layer 14 in such a way that the evaporation rates of the Alq3 and lithium fluoride (LiF) were respectively so adjusted that the Alq3 and lithium fluoride were mixed in the film thickness ratio of 9:1. Finally, aluminum (Al) was evaporated to form the cathode electrode 15 in a thickness of 150 nm on the organic compound layer 14 under the condition of the evaporation rate of 1 nm/sec.

In this way, a light-emitting element was obtained by providing, on the transparent substrate 10, the anode electrode 11, hole transporting layer 12, light-emitting layer 13, organic compound layer 14, and cathode electrode 15. Successively, while a direct current voltage was applied between the ITO as the anode electrode 11 and the aluminum as the cathode electrode 15 in the light-emitting element, the light-emitting characteristics of the element were measured. Consequently, the element exhibited a maximum luminance of 23900 $cd/m^2$ and a current density of 2450 $mA/cm^2$ at an applied voltage of 18 V. In addition, the element exhibited a maximum efficiency of 0.78 lm/W at an applied voltage of 5 V. The voltage-luminance characteristic of the light-emitting element is shown in FIG. 3 and FIG. 4.

Comparative Example 5

In the present comparative example, lithium fluoride (LiF) was used in place of the organic compound layer composed of a carbonate and an organic compound in Example 1.

Under the conditions similar to those in Example 1, at the beginning, an α-NPD film of 35 nm in thickness was formed as the hole transporting layer on the ITO as the anode electrode, and thereon an Alq3 film of 50 nm in thickness was sequentially formed as the light-emitting layer. Then, lithium fluoride (LiF) was evaporated to form a film of 1 nm. Finally, aluminum (Al) was evaporated to form the cathode electrode in a thickness of 150 nm under the condition of the evaporation rate of 1 nm/sec.

In this way, a light-emitting element was obtained by providing, on the transparent substrate, the anode electrode, hole transporting layer, light-emitting layer, lithium fluoride (LiF), and cathode electrode. Successively, while a direct current voltage was applied between the ITO as the anode electrode and the aluminum as the cathode electrode in the light-emitting element, the light-emitting characteristics of the element were measured. Consequently, the element exhibited a maximum luminance of 26790 $cd/m^2$ and a current density of 2188 $mA/cm^2$ at an applied voltage of 18 V. In addition, the element exhibited a maximum efficiency of 0.86 lm/W at an applied voltage of 5 V. The voltage-luminance characteristic of the light-emitting element is shown in FIG. 3 and FIG. 4.

Example 2

The present example is an example in which gold is used for the cathode electrode contrary to Example 1.

Under the conditions similar to those in Example 1, at the beginning, an α-NPD film of 35 nm in thickness was formed as the hole transporting layer 12 on the ITO as the anode electrode 11, and thereon an Alq3 film of 15 nm in thickness was formed as the light-emitting layer 13. Then, Alq3 and cesium carbonate ($Cs_2CO_3$) were evaporated to form a film of 35 nm in thickness as the organic compound layer 14 in such a way that the evaporation rates of the Alq3 and cesium carbonate were respectively so adjusted that the Alq3 and cesium carbonate were mixed in the film thickness ratio of 9:1. Finally, gold (Au) was evaporated to form the cathode electrode 16 in a thickness of 150 nm on the organic compound layer 14 under the condition of the evaporation rate of 1 nm/sec. The molar ratio of Alq3 to cesium carbonate in the organic compound layer was 1:0.57.

In this way, a light-emitting element was obtained by providing, on the transparent substrate 10, the anode electrode 11, hole transporting layer. 12, light-emitting 13, organic compound layer 14, and cathode electrode 15. Successively, while a direct current voltage was applied between the ITO as the anode electrode 11 and the gold (Au) as the cathode electrode 15 in the light-emitting element, the light-emitting characteristics of the element were measured. Consequently, the element exhibited a maximum luminance of 29700 $cd/m^2$ and a current density of 3000 $mA/cm^2$ at an applied voltage of 15 V. In addition, the element exhibited a maximum efficiency of 0.79 lm/W at an applied voltage of 6 V. The voltage-luminance characteristic of the light-emitting element is shown in FIG. 4.

Comparative Example 6

In the present comparative example, lithium fluoride was used instead of a carbonate used in Example 2.

Under the conditions similar to those in Example 2, at the beginning, an α-NPD film of 35 nm in thickness was formed as the hole transporting layer 12 on the ITO as the anode electrode 11, and thereon an Alq3 film of 15 nm in thickness was formed as the light-emitting layer 13. Then, Alq3 and lithium fluoride (LiF) were evaporated to form a film of 35 nm in thickness as the organic compound layer 14 in such a way that the evaporation rates of the Alq3 and lithium fluoride were respectively so adjusted that the Alq3 and lithium fluoride were mixed in the film thickness ratio of 9:1. Finally, gold (Au) was evaporated to form the cathode electrode 15 in a thickness of 150 nm on the organic compound layer 14 under the condition of the evaporation rate of 1 nm/sec.

In this way, a light-emitting element was obtained by providing, on the transparent substrate 10, the anode electrode 11, hole transporting layer 12, light-emitting layer 13, organic compound layer 14, and cathode electrode 15. Successively, while a direct current voltage was applied between the ITO as the anode electrode 11 and the gold (Au) as the cathode electrode 15 in the light-emitting element, the light-emitting characteristics of the element were measured. Consequently, the element exhibited a maximum luminance of 93 $cd/m^2$ and a current density of 26 $mA/cm^2$ at an applied voltage of 25 V. In addition, the element exhibited a maximum efficiency of 0.047 lm/W at an applied voltage of 24 V. The voltage-luminance characteristic of the light-emitting element is shown in FIG. 4.

When lithium fluoride is used in the organic compound layer, the electron injecting characteristic becomes good by using the cathode made of aluminum, but the electron injecting characteristic is degraded by using the cathode made of gold. On the contrary, when a carbonate is used, a satisfactory electron injecting characteristic is obtained by using either the cathode made of aluminum or the cathode made of gold, in other words, the degree of freedom in choosing the cathode material is increased.

Example 3

Figure 5:
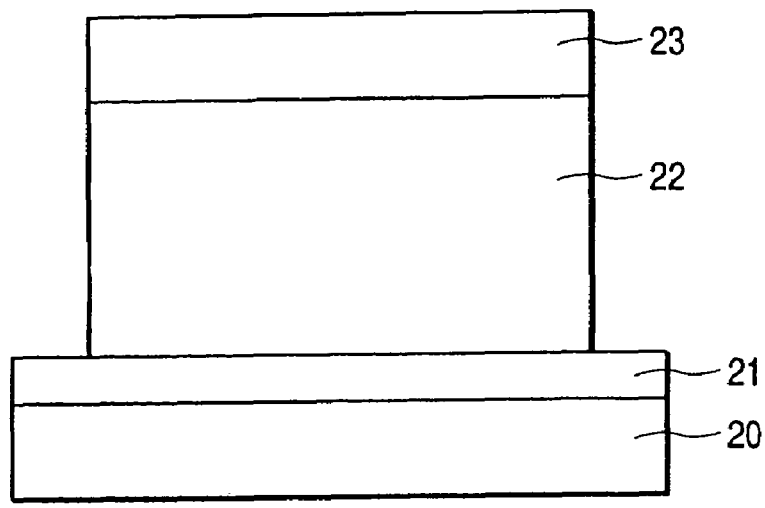
FIG. 5 is a schematic diagram showing the third example.

FIG. 5 illustrates Example 3 of the present invention. In FIG. 5, numeral 20 denotes a substrate, and 21 a lower face electrode, 22 an organic compound layer, and 23 an upper face electrode, respectively.

The substrate 20 was subjected to ultrasonic cleaning successively with acetone and isopropyl alcohol (IPA), and then cleaned in boiling IPA and dried. Then, using a vacuum evaporation apparatus (manufactured by Shinku-Kiko, Inc.), on the cleaned substrate, aluminum (Al) was evaporated by the vacuum evaporation method to form a film of 50 nm in thickness as the lower face electrode 21. The evaporation conditions were that the degree of the vacuum when evaporating was $1.0 \times 10^{-6}$ Torr, and the evaporation rate was from 1 nm/sec. Then, Alq3 and cesium carbonate ($Cs_2CO_3$) were evaporated to form a film of 50 nm in thickness as the organic compound layer 22 in such a way that the evaporation rates of the Alq3 and cesium carbonate were respectively so adjusted that the Alq3 and cesium carbonate were mixed in the film thickness ratio of 9:1. Finally, aluminum (Al), the same material as that for the lower face electrode, was evaporated to form the upper face electrode 23 in a thickness of 150 nm on the organic compound layer 22 under the condition of the evaporation rate of 1 nm/sec. The molar ratio of Alq3 to cesium carbonate in the organic compound layer was 1:0.57.

In this way, there was obtained an element which was provided, on the substrate 20, with the lower face electrode 21, organic compound layer 22, and upper face electrode 23. While a direct current voltage was applied to the element between either the lower face electrode 21, as the anode and the upper face electrode 23 as the cathode or between the lower face electrode 21 as the cathode and the upper face electrode 23 as the anode, the voltage-current characteristics were measured. Consequently, at an applied voltage of 10 V, the current density was respectively 2250 mA/cm² in the case of using the upper face electrode 23 as the cathode and 1960 mA/cm² in the case of using the lower face electrode 21 as the cathode.

Comparative Example 7

In the present comparative example, lithium fluoride was used in place of a carbonate used in Example 3.

Under the conditions similar to those in Example 3, an aluminum (Al) film of 50 nm in thickness is formed as the lower face electrode 21, and thereon Alq3 and lithium fluoride (LiF) were evaporated to form a film of 50 nm in thickness as the organic compound layer 22 in such a way that the evaporation rates of the Alq3 and lithium fluoride were respectively so adjusted that the Alq3 and lithium fluoride were mixed in the film thickness ratio of 9:1. Finally, aluminum (Al) was evaporated to form the top face electrode 23 in a thickness of 150 nm on the organic compound layer 22 under the condition of the evaporation rate of 1 nm/sec.

In this way, there was obtained an element which was provided, on the transparent substrate 20, with the lower face electrode 21, organic compound layer 22, and upper face electrode 23. While a direct current voltage was applied to the element between either the lower face electrode 21 as the anode and the upper face electrode 23 as the cathode or between the lower face electrode 21 as the cathode and the upper face electrode 23 as the anode, the voltage-current characteristics were measured. Consequently, at an applied voltage of 10 V, the current density was respectively 935 mA/cm² in the case of using the upper face electrode 23 as the cathode, and 11 mA/cm² in the case of using the lower face electrode 21 as the cathode.

From the results in Comparative Example 7, it can be seen that in the element in which lithium fluoride (LiF) is used in the organic compound layer, the current flows when electrons are injected from the side of the upper face electrode 23 formed as a film subsequent to the formation of the organic compound layer, but electrons can be scarcely injected from the side of the lower face electrode 21 formed beforehand. A light-emitting element having an electrode formed in a heated state on the organic compound layer containing a salt can make the current flow satisfactorily.

On the other hand, in the element according to the present invention in which cesium carbonate ($Cs_2CO_3$) is used in the organic compound layer 22, it is possible that the barrier for electron injection from the cathode is reduced and thereby the driving voltage of the element is lowered without being subjected to any restrictions in the order of the film formation for the organic compound layer 22 and the electrode in contact with the organic compound layer.

Example 4

The present example is an example of an element in which an additional layer (block layer) is provided between the organic compound layer and the light-emitting layer.

Figure 6:
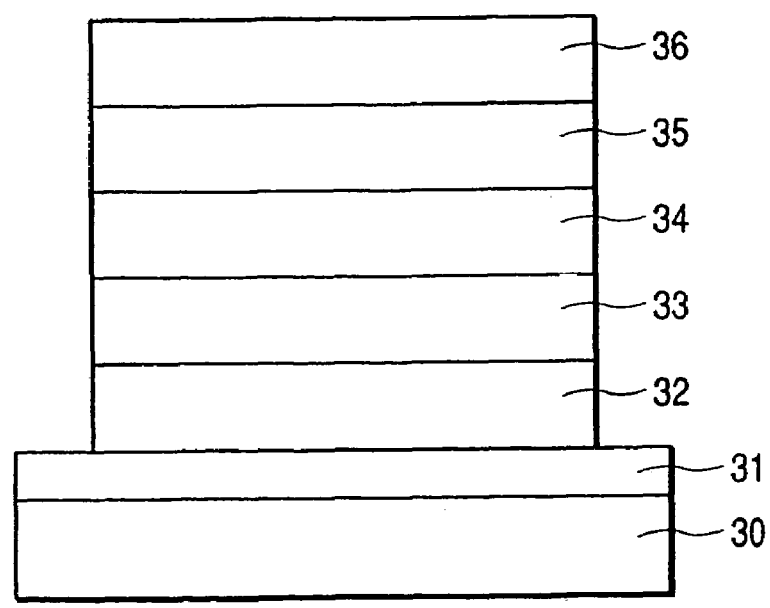
FIG. 6 is a schematic diagram showing the stacked layer configuration in the light-emitting element of the fourth example.

The element of Example 4 is illustrated in FIG. 6. In FIG. 6, numeral 30 denotes a transparent substrate on the anode side, and 31 the ITO layer as an anode electrode for use in hole injection, 32 a hole transporting layer, 33 a light emitting layer, 34 a block layer, 35 an organic compound layer, and 36 a cathode.

Under the conditions similar to those in Example 1, at the beginning, an α-NPD film of 35 nm in thickness was formed as the hole transporting layer 32 on the ITO as the anode electrode 31, and thereon an Alq3 film of 15 nm in thickness was formed as the light-emitting layer 33. Then, a 10 nm thick film of bathophenanthroline (hereinafter, referred to as "B-phen") represented by the following chemical formula 3:

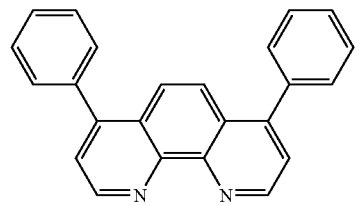

was formed as the block layer 34. Successively, B-phen and cesium carbonate ($Cs_2CO_3$) were evaporated to form a film of 25 nm in thickness on the block layer 34 as the organic compound layer 35 in such a way that the evaporation rates of the B-phen and cesium carbonate were respectively so adjusted that the B-phen and cesium carbonate were mixed in the film thickness ratio of 8.8:1.2. Finally, a film of aluminum (Al) of 150 nm in thickness was evaporated as the cathode electrode 36 on the organic compound layer 35 under the condition of the evaporation rate of 1 nm/sec. The molar ratio of the B-phen to $Cs_2CO_3$ in the organic compound layer 35 was 1:0.5.

In this way, a light-emitting element was obtained by providing, on the transparent substrate 30, the anode electrode 31, hole transporting layer 32, light-emitting layer 33, block layer 34, organic compound layer 35, and cathode electrode 36. Successively, while a direct current voltage was applied between the ITO as the anode electrode 31 and the aluminum as the cathode electrode 36 in the light-emitting element, the light-emitting characteristics of the element were measured.

Figure 7:
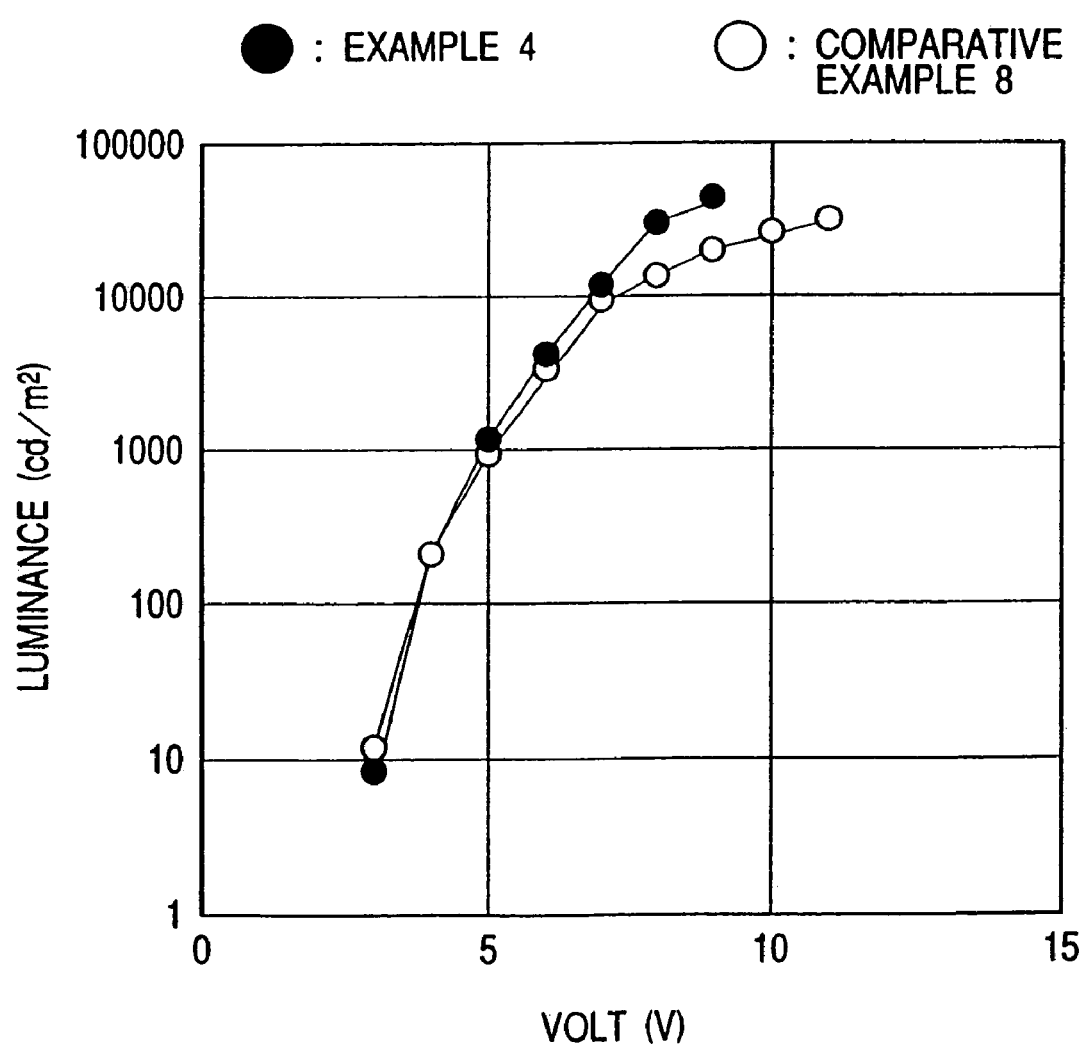
FIG. 7 is a graph showing the voltage-luminance characteristics in the fourth example and the eighth comparative example.

Consequently, the element exhibited a maximum luminance of 44105 cd/m² and a current density of 1760 mA/cm² at an applied voltage of 9 V. In addition, the element exhibited a maximum efficiency of 2.3 lm/W at an applied voltage of 5 V. The voltage-luminance characteristic of the light-emitting element is shown in FIG. 7.

Comparative Example 8

In the present comparative example, the block layer 34 used in Example 4 is not used.

Under the conditions similar to those in Example 4, at the beginning, an α-NPD film of 35 nm in thickness was formed as the hole transporting layer 32 on the ITO as the anode electrode 31, and thereon an Alq3 film of 15 nm in thickness was formed as the light-emitting layer 33. Successively, B-phen and cesium carbonate ($Cs_2CO_3$) were evaporated to form a film of 35 nm in thickness on the light-emitting layer 33 as the organic compound layer 35 in such a way that the evaporation rates of the B-phen and cesium carbonate were respectively so adjusted that the B-phen and cesium carbonate were mixed in the film thickness ratio of 8.8:1.2. Finally, a film of aluminum (Al) of 150 nm in thickness was evaporated as the cathode electrode 36 on the organic compound layer 35.

In this way, a light-emitting element was obtained by providing, on a transparent substrate 30, the anode electrode 31, hole transporting layer 32, light-emitting layer 33, organic compound layer 35, and cathode electrode 36. Successively, while a direct current voltage was applied between the ITO as the anode electrode 31 and the aluminum as the cathode electrode 36 in the light-emitting element, the light-emitting characteristics of the element were measured. Consequently, the element exhibited a maximum luminance of 33751 cd/m² and a current density of 3223 mA/cm² at an applied voltage of 11 V. In addition, the element exhibited a maximum efficiency of 1.01 lm/W at an applied voltage of 5 V. The voltage-luminance characteristic of the light-emitting element is shown in FIG. 7.

The light-emitting element shown in Example 4 which has the block layer and the organic compound layer containing cesium carbonate is improved largely in the light-emitting efficiency as compared to the element in Comparative Example 8 in which no block layer was provided. The block layer has a function blocking the transit of the holes injected from the anode electrode through the light-emitting layer, and is a layer for preventing the penetration of the carbonate, contained in the organic compound layer superposed on the block layer, into the light-emitting layer. If the carbonate penetrates the light-emitting layer, the penetrated portions do not emit light so that the light-emitting efficiency is degraded. Incidentally, the reason why the carbonate contained in the organic compound layer penetrates the light-emitting layer is not clear at present; the present inventors conceive that the carbonate gets into the light-emitting layer owing to the energy acquired through film formation.

It can be seen that such a block layer is effective in improving the light-emitting efficiency which block layer is provided between the light-emitting layer and the organic compound layer, blocks the transmit of the holes through the emitting layer, and prevents the penetration of the carbonate used in the organic compound layer into the light-emitting layer.

As described above with reference to Embodiments and Examples, according to the present invention, there can be provided a light-emitting element in which the organic compound layer composed of a carbonate easy in handling and an organic compound is in contact with the cathode.

The invention claimed is:

1. A method of producing a light-emitting element comprising an anode, a cathode, a light-emitting layer and an organic compound layer, wherein the light-emitting layer and the organic compound layer are provided between the anode and the cathode, the organic compound layer is provided at a position closer to the cathode than the light-emitting layer, and the organic compound layer is in electrical contact with the cathode, the method comprising:
   providing the light-emitting layer, and
   providing the organic compound layer by heating cesium carbonate.

2. A method of producing a light-emitting element comprising an anode, a cathode, a light-emitting layer and an organic compound layer, wherein the light-emitting layer and the organic compound layer are provided between the anode and the cathode, the organic compound layer is provided at a position closer to the cathode than the light-emitting layer, and the organic compound layer is in electrical contact with the cathode, the method comprising:
   providing the light-emitting layer,
   providing the organic compound layer by heating a carbonate, and
   providing at least a third layer between the anode and the cathode.

3. The method according to claim 2, wherein the third layer is a hole transporting layer provided between the light-emitting layer and the anode.

4. The method according to claim 2, wherein the third layer is a hole injecting layer provided between the light-emitting layer and the anode.

5. A method of producing a light-emitting element comprising an anode, a cathode, a light-emitting layer and an organic compound layer, wherein the light-emitting layer and the organic compound layer are provided between the anode and the cathode, the organic compound layer is provided at a position closer to the cathode than the light-emitting layer, and the organic compound layer is in electrical contact with the cathode, the method comprising:
   providing the light-emitting layer,
   providing the organic compound layer by heating a carbonate, and
   providing a hole-transporting layer between the light-emitting layer and the anode, and a hole-injecting layer between the hole-transporting layer and the anode.

6. A method of producing a light-emitting element comprising an anode, a cathode, a light-emitting layer and an organic compound layer, wherein the light-emitting layer and the organic compound layer are provided between the anode and the cathode, the organic compound layer is provided at a position closer to the cathode than the light-emitting layer, and the organic compound layer is in electrical contact with the cathode, the method comprising:
   providing the light-emitting layer,
   providing the organic compound layer by heating a carbonate, and
   providing a hole-transporting layer between the light-emitting layer and the organic compound layer.

* * * * *